(12) United States Patent
Lee

(10) Patent No.: US 10,336,133 B2
(45) Date of Patent: Jul. 2, 2019

(54) MAGNETIC WHEEL

(71) Applicant: TAS GLOBAL CO., LTD., Busan (KR)

(72) Inventor: Dong Wook Lee, Seoul (KR)

(73) Assignee: TAS GLOBAL CO., LTD., Busan (KR)

( * ) Notice: Subject to any disclaimer, the term of this patent is extended or adjusted under 35 U.S.C. 154(b) by 0 days.

(21) Appl. No.: 15/538,181

(22) PCT Filed: Dec. 18, 2015

(86) PCT No.: PCT/KR2015/013975
§ 371 (c)(1),
(2) Date: Jun. 20, 2017

(87) PCT Pub. No.: WO2016/105038
PCT Pub. Date: Jun. 30, 2016

(65) Prior Publication Data
US 2017/0355225 A1    Dec. 14, 2017

(30) Foreign Application Priority Data
Dec. 23, 2014   (KR) .................. 10-2014-0187443

(51) Int. Cl.
*H01F 7/02* (2006.01)
*B60B 19/00* (2006.01)
*B63B 59/08* (2006.01)
*B63B 59/10* (2006.01)
*B62D 55/265* (2006.01)
(Continued)

(52) U.S. Cl.
CPC .............. *B60B 19/006* (2013.01); *B08B 7/00* (2013.01); *B60B 19/12* (2013.01); *B62D 55/265* (2013.01); *B63B 59/08* (2013.01); *B63B 59/10* (2013.01); *B63C 5/00* (2013.01); *H01F 7/02* (2013.01); *H05K 9/0075* (2013.01); *B60B 2310/302* (2013.01); *B60B 2310/305* (2013.01); *B60B 2310/306* (2013.01); *B60B 2310/311* (2013.01);
(Continued)

(58) Field of Classification Search
CPC .......... H01F 7/00; B60B 19/006; B63C 5/00; B08B 7/00; H05K 9/0075
USPC ........................................... 335/302
See application file for complete search history.

(56) References Cited

U.S. PATENT DOCUMENTS 3,499,199 A * 3/1970 Chivas ............... B65G 29/00
198/690.1
6,125,955 A * 10/2000 Zoretich ............ B60B 19/006
152/44

(Continued)

FOREIGN PATENT DOCUMENTS

JP    05-185964 A    7/1993
JP    05-286466 A    11/1993
(Continued)

*Primary Examiner* — Shawki S Ismail
*Assistant Examiner* — Lisa N Homza
(74) *Attorney, Agent, or Firm* — Heedong Chae; Lucem, PC

(57) ABSTRACT

A magnetic wheel includes: a balance block; a magnetic body which is provided in the balance block and attaches the balance block to an attachment object with a magnetic force; and a magnetic shielding block which is provided in the balance block and guides a magnetic field generated in the magnetic body toward the attachment object.

10 Claims, 17 Drawing Sheets

(51) Int. Cl.
*B08B 7/00* (2006.01)
*B63C 5/00* (2006.01)
*H05K 9/00* (2006.01)
*B60B 19/12* (2006.01)

(52) U.S. Cl.
CPC ....... *B60B 2360/50* (2013.01); *B60B 2380/10* (2013.01); *B60B 2900/931* (2013.01)

(56) References Cited

U.S. PATENT DOCUMENTS

| | | | |
|---|---|---|---|
| 7,233,221 B2 * | 6/2007 | Reboredo Losada | B60B 3/048 105/78 |
| 2006/0162610 A1 | 7/2006 | Reboredo Losada et al. | |
| 2009/0078484 A1 * | 3/2009 | Kocijan | B60L 3/048 180/167 |
| 2011/0050374 A1 * | 3/2011 | Dvorak | A63H 17/42 335/219 |
| 2012/0006352 A1 * | 1/2012 | Holappa | B08B 1/008 134/6 |
| 2012/0007705 A1 * | 1/2012 | Fullerton | E05C 19/16 335/306 |
| 2012/0242440 A1 * | 9/2012 | Fullerton | E05C 19/16 335/306 |
| 2014/0230711 A1 * | 8/2014 | Lovelace | B63B 59/08 114/222 |
| 2015/0151572 A1 * | 6/2015 | Parrott | B60B 19/12 301/5.23 |
| 2016/0325794 A1 * | 11/2016 | Baur | B62D 57/024 |
| 2017/0334241 A1 * | 11/2017 | Gonzalez | B08B 9/049 |
| 2018/0154910 A1 * | 6/2018 | Li | B61B 13/08 |
| 2018/0232874 A1 * | 8/2018 | Ostervold | G06T 7/0004 |

FOREIGN PATENT DOCUMENTS

| | | |
|---|---|---|
| JP | 10-067202 A | 3/1998 |
| KR | 10-0599402 B1 | 7/2006 |
| KR | 10-2010-0066159 A | 6/2010 |

\* cited by examiner

MAGNETIC WHEEL

CROSS-REFERENCE TO RELATED APPLICATION

This application claims the benefit of Korean Application No. 10-2014-0187443 filed on Dec. 23, 2014 with the Korean Intellectual Property Office, the disclosure of which is incorporated herein by reference.

TECHNICAL FIELD

The present invention relates to a magnetic wheel and more particularly, to a magnetic wheel rotatably attached to an attachment object including the bottom of a ship.

BACKGROUND ART

In general, aquatic creatures living under water, such as barnacles, sea squirts, serpula, mytilus galloprovincialis, freshwater shellfish, lagoon bugyul body, visible bluish, greener and so on, adhere to and live in a surface of the body of a ship, which does various damage to the ship.

For example, aquatic creatures adhered to the ship body may increase frictional resistance to seawater, thereby decreasing a sailing speed of the ship and increasing fuel consumption, which is at an economic disadvantage.

Conventionally, a cleaning work by a worker of moving a ship to be cleaned to a land dock and stripping off attachments of the wall of the ship by jetting water with a high pressure hose has been generally used. Since this method requires a preparation procedure to move the ship to the dock, there is a disadvantage that long cleaning time is taken and many workers are mobilized.

A diver may clean the bottom of the ship under water, without moving the ship. However, even for a diver skilled at underwater work environments, it takes a long time to clean a wide range of ship body and the level of difficulty in the cleaning work increases due to poor visibility.

In order to avoid the problem that cleaning the bottom of the ship by a worker is difficult to remove attachments efficiently and requires many workers, there has been proposed a method of applying paints mixed with toxic material in order to prevent marine creatures from adhering and parasitizing in the surface of a ship.

However, the proposed method causes other problems of seawater pollution and detrimental effects on other marine creatures to destroy the aquatic ecosystems and is therefore forbidden by international organizations. In addition, when the toxicity decreases after lapse of certain time, paints should be again applied after cleaning.

In order to overcome such a problem, there has been proposed a technique that a cleaning robot removes deposits while moving along the wall of a ship under water.

"An underwater robot for cleaning and inspection of the bottom of a ship" disclosed in KR Patent Registration No. 10-0811540 is a propulsive apparatus which moves along the wall of a ship body and cleans the wall using a brush fixed at the underwater robot.

However, this method causes upsizing of cleaning equipment due to a propeller, which results in difficulty in efficient cleaning of the ship bottom having a large curvature, and requires many sensors used to stably move the robot along the wall of the ship body, which results in high costs.

In order to clean the bottom of a ship, it is important to closely attach a cleaning apparatus to the ship bottom. To this end, there has been proposed a method of using a magnetic wheel.

FIG. 1 is a schematic view showing a conventional magnetic wheel.

As shown in FIG. 1, the conventional magnetic wheel is used in such a manner that a ferromagnetic circular plate and a magnet are rotated together.

This magnetic wheel is commonly used since a magnetic force, line is concentrated on a ferromagnetic floor when the magnetic wheel is attached to the floor, and its structure is simple.

However, an adsorptive force may be rapidly weakened if there occurs an empty space between any circular plate and the floor.

FIG. 2 is a schematic view showing another conventional magnetic wheel.

The magnetic wheel shown in FIG. 2 maintains an adsorptive force to some degrees even when there occurs an empty space between any circular plate and the floor, unlike the magnetic wheel shown in FIG. 1.

However, this magnetic wheel has poor efficiency since only some of magnets used contact the floor.

In addition, the vicinity of the magnetic wheel is affected since a strong magnetic field ejects to a portion which is in no contact with the ferromagnetic floor. If a worker is present in the vicinity of the magnetic wheel, the worker may be injured due to the magnets.

Further, when the magnetic wheel is rotated, since the magnets are arrange at constant intervals, the adsorptive force to the floor may not be uniformed.

The above description is only provided as a background to assist in understandings of the present invention but is not intended to elucidate the technique known in the art to which the present invention belongs.

RELATED TECHNICAL DOCUMENT

Patent Document (Patent Document 1) KR latent Registration No. 10-0599402 (owned by Daewoo Shipbuilding Marine Engineering Co. Ltd., and issued at Jul. 4, 2006)

DISCLOSURE

Technical Problem

Accordingly, it is an object of the present invention to provide a magnetic wheel in which a magnetic adsorptive force is not rapidly weakened even when the magnetic wheel is detached from a ferromagnetic floor and an effect of a magnetic field on the vicinity of the magnetic wheel can be minimized by magnetic shielding capability.

Technical Solution

According to an aspect of the present invention, there is provided a magnetic wheel comprising: a balance block; a magnetic body which is provided in the balance block and attaches the balance block to an attachment object with a magnetic force; and a magnetic shielding block which is provided in the balance block and guides a magnetic field generated in the magnetic body toward the attachment object.

Preferably, the magnetic shielding block shields all regions except the bottom of the magnetic body directing to the attachment object.

Preferably, the magnetic shielding block includes a ceiling portion for shielding the magnetic field generated in the magnetic body from going toward the center of the balance block; and a wall portion which is connected to the ceiling portion and prevents the magnetic field from ejecting in the lateral directions of the magnetic body.

Preferably, the magnetic shielding block is coupled to the balance block according to one selected from a group consisting of fitting and welding.

Preferably, the magnetic shielding block is provided to be perpendicular to the center of the balance block.

Preferably, the balance block includes a circular block body; and a frame portion which is provided at an edge of the block body and has a larger diameter than the block body.

Preferably, the magnetic body is provided in the block body.

Preferably, a bearing to rotatably support a rotating shaft passing through the block body is provided in the block body.

Preferably, a friction member is provided in the block body.

Preferably, the balance block is removably coupled to the block body or is integrated with the block body.

Preferably, the magnetic body includes a permanent magnet.

Advantageous Effects

According to the embodiments of the present inventions, a magnetic adsorptive force is not rapidly weakened even when the magnetic wheel is detached from a ferromagnetic floor and an effect of a magnetic field on the vicinity of the magnetic wheel can be minimized by magnetic shielding capability.

MODE FOR INVENTION

Figure 1:
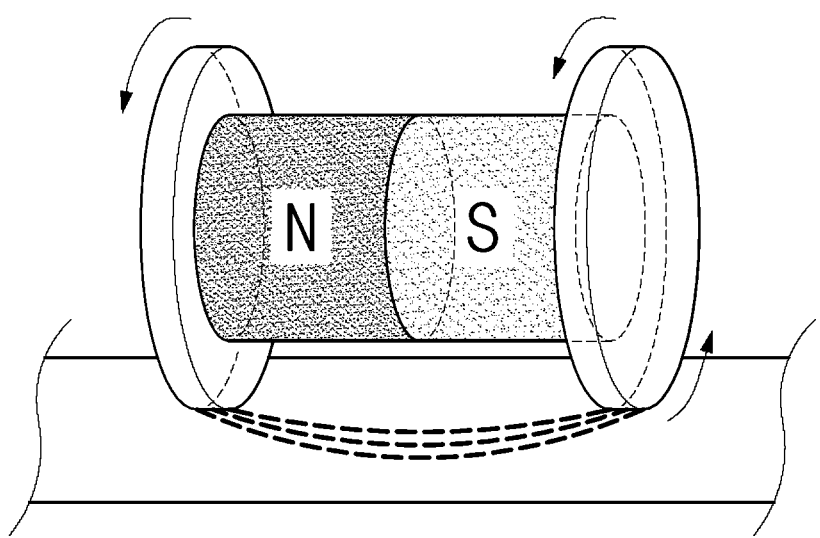
FIG. 1 is a schematic view showing a conventional magnetic wheel.
Figure 2:
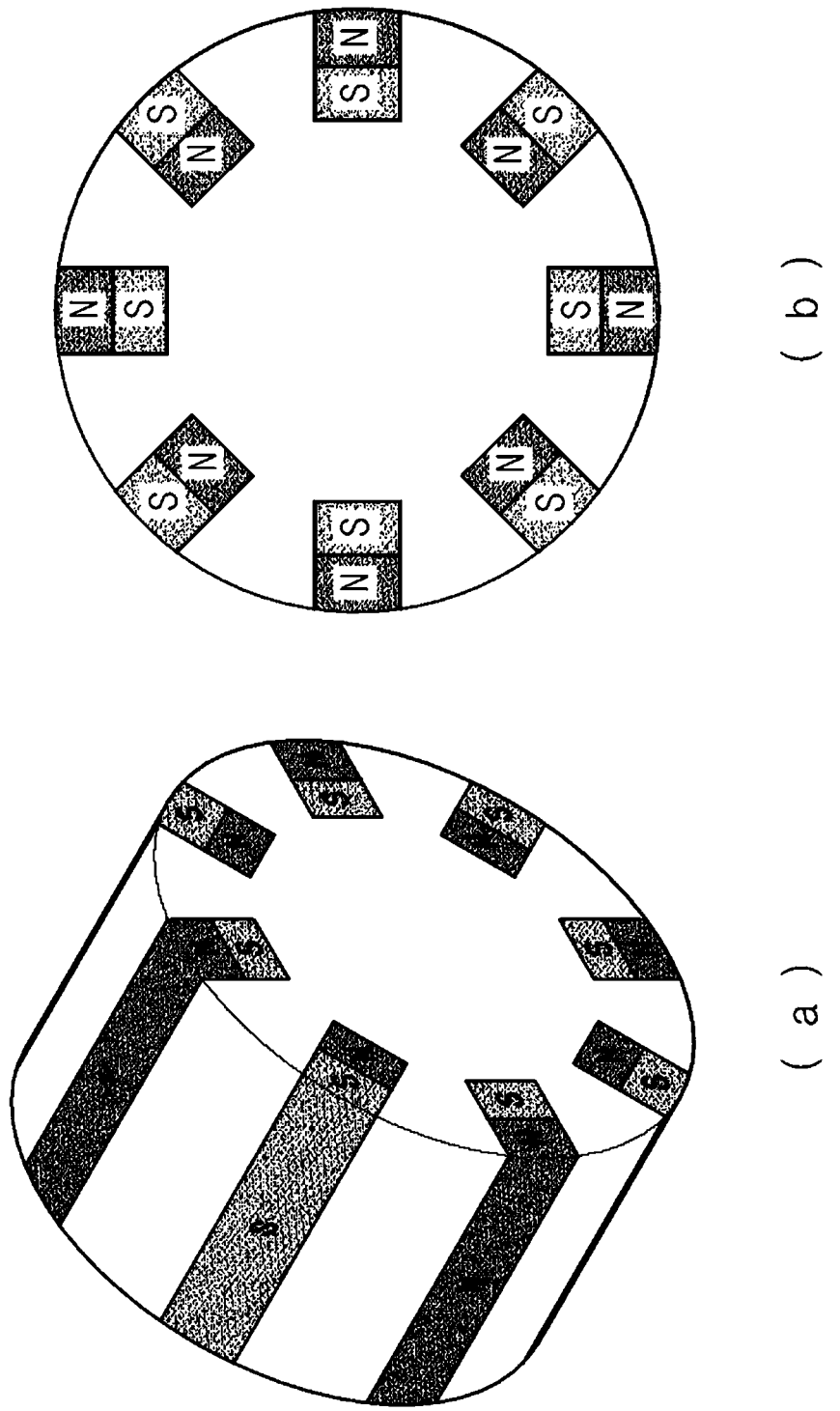
FIG. 2 is a schematic view showing another conventional magnetic wheel.

In order to fully understand the present invention, advantages of operation of the present invention, and purposes achieved by embodiments of the present invention, the accompanying drawings illustrating preferred embodiments of the present invention and contents described in the accompanying drawings should be referenced.

Hereinafter, preferred embodiments of the present invention will be described with reference to the accompanying drawings. Throughout the drawings, the same elements are denoted by the same reference numerals.

Figure 3:
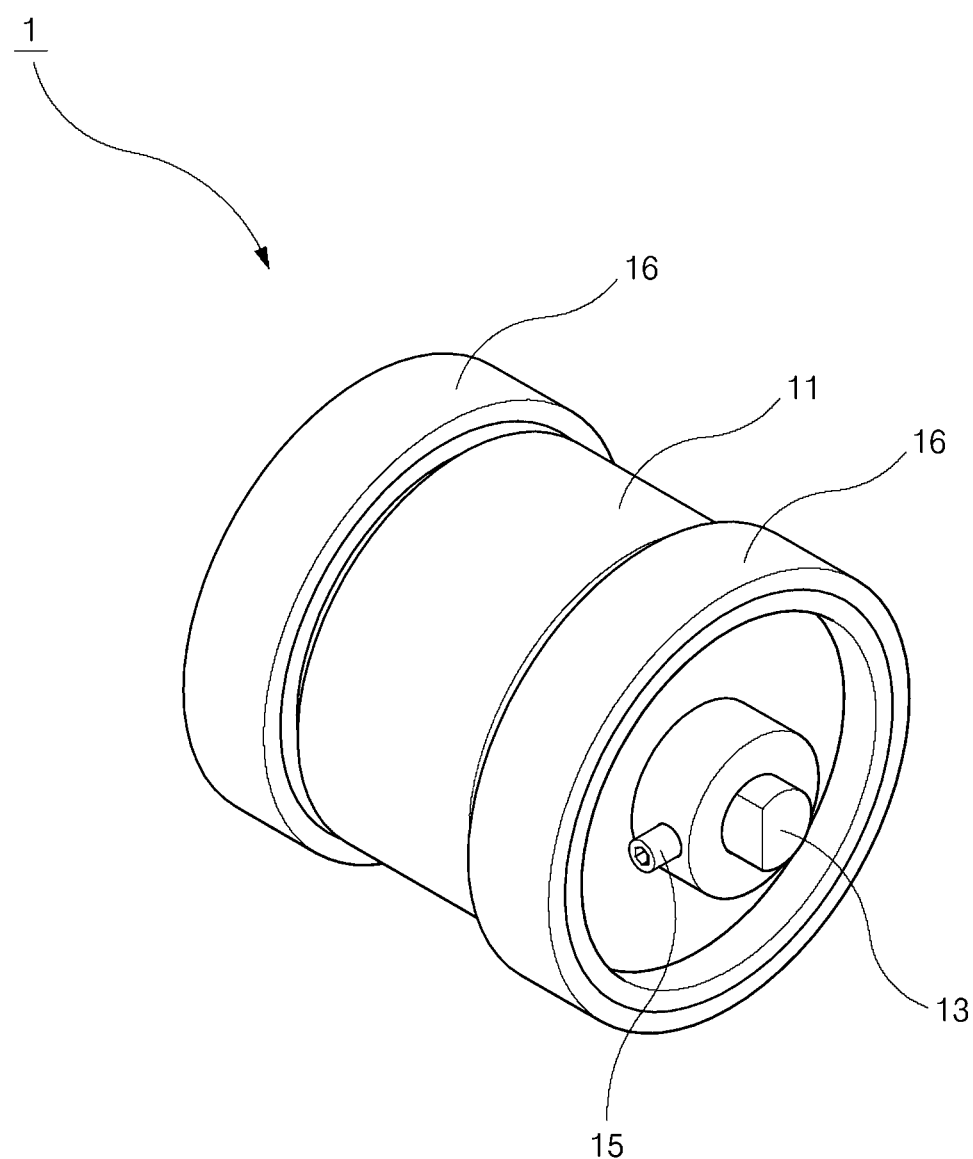
FIG. 3 is a schematic perspective view showing a magnetic wheel according to a first embodiment of the present invention.
Figure 4:
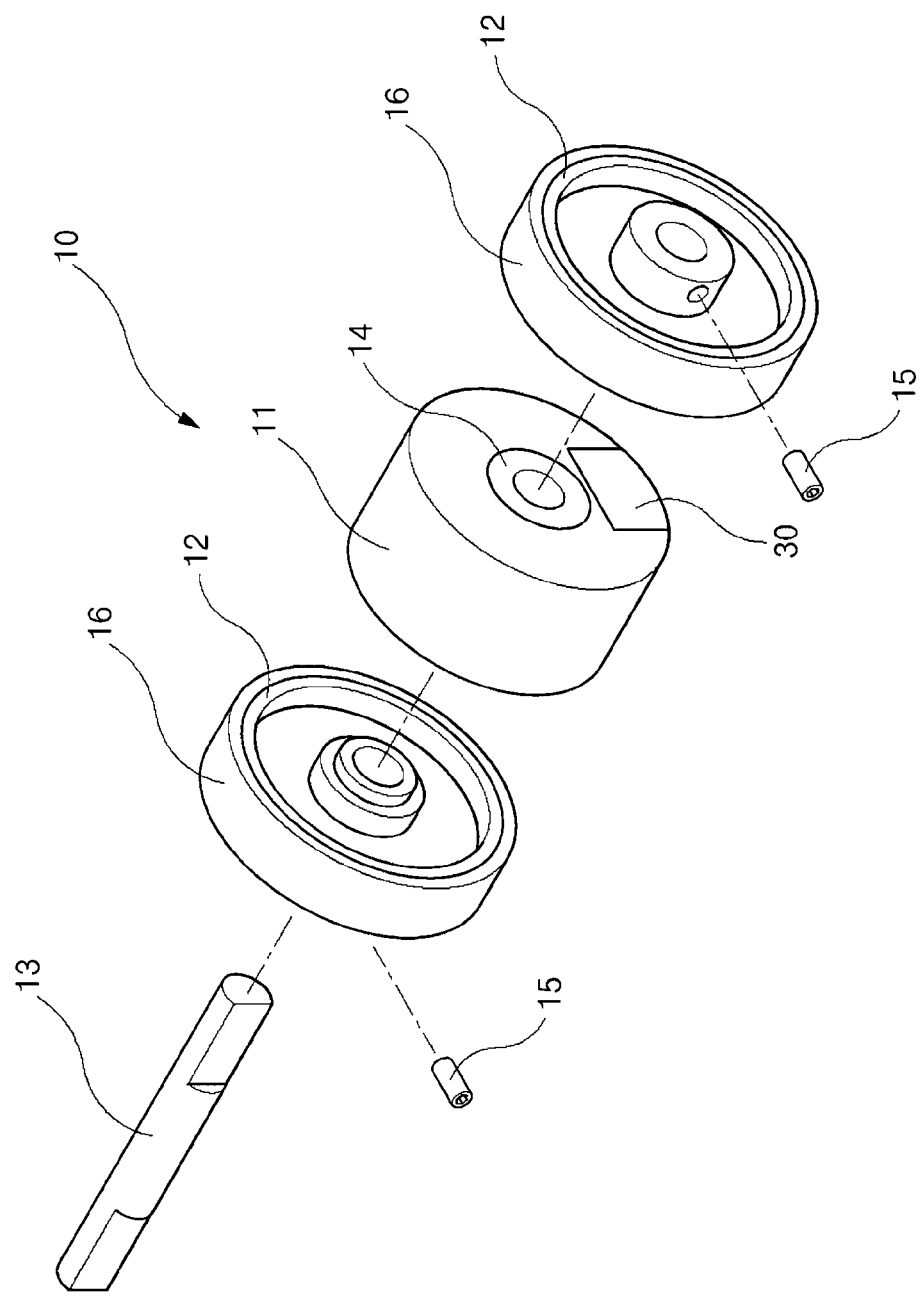
FIG. 4 is an exploded perspective view of FIG. 3.
Figure 5:
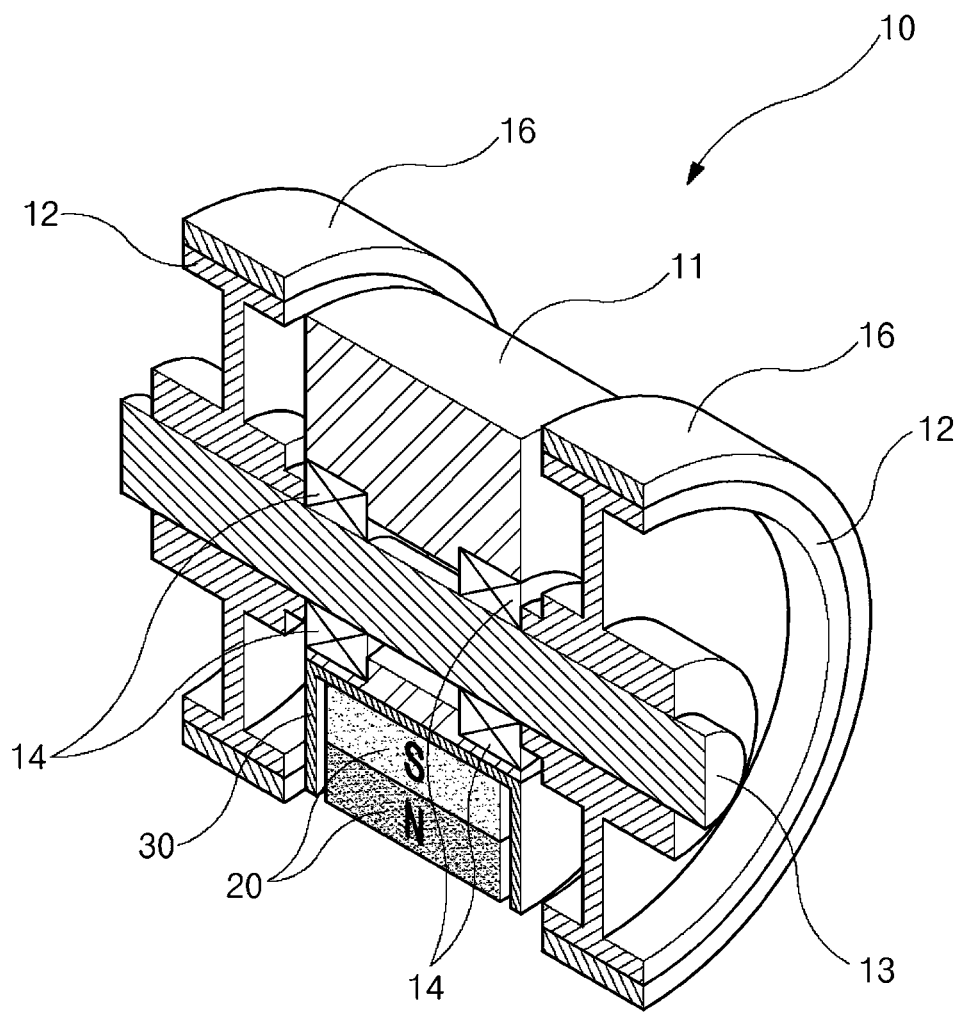
FIG. 5 is a side sectional view of FIG. 3.
Figure 6:
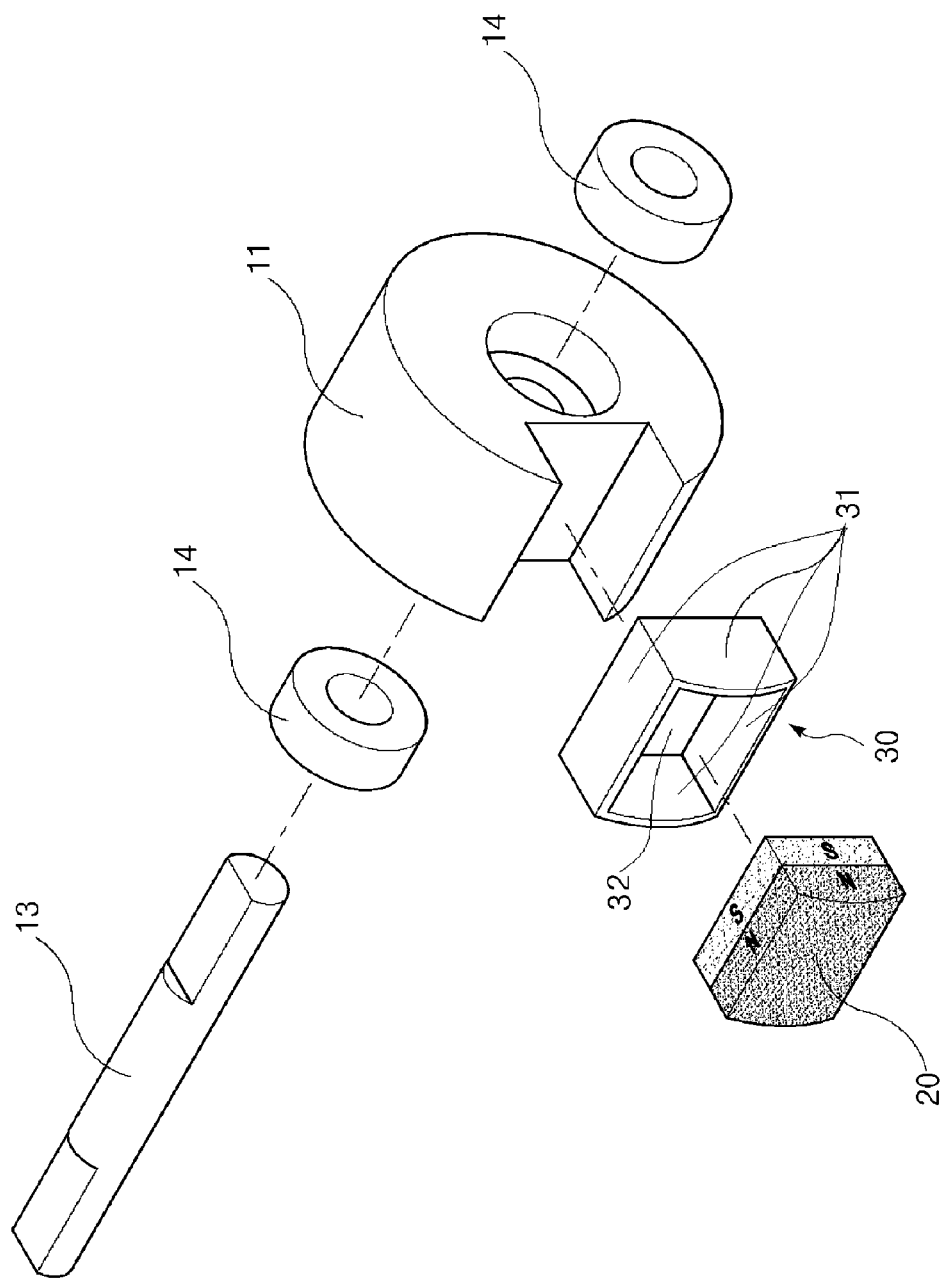
FIG. 6 is a partial exploded perspective view of FIG. 5.

FIG. 3 is a schematic perspective view a magnetic wheel according to a first embodiment of the present invention. FIG. 4 is an exploded perspective view of FIG. 3. FIG. 5 is a side sectional view of FIG. 3. FIG. 6 is a partial exploded perspective view of FIG. 5.

As shown in these figures, a magnetic wheel 1 according to this embodiment includes a balance block 10, a magnetic body 20 which is provided in the balance block 10 and attaches the balance block 10 to an attachment object P with a magnetic force, and a magnetic shielding block 30 which is provided in the balance block 10 and guides a magnetic field generated in the magnetic body 20 toward the attachment object P.

The balance block 10 is provided in a form to be easily rotated in accordance with a weight balance of the magnetic shielding block 30 and plays a role to maintain the bottom of the magnetic body 20 in parallel to the attachment object P (for example, the bottom of a ship) in all directions.

In this embodiment, as shown in FIG. 4, the balance block 10 includes a block body 11, a frame portion 12 provided in both sides of the block body 11, a support shaft 13 rotatably provided in the block body 11 through the central portion of the block body 11, a bearing 14 which is provided in a through-hole of the block body 11 and supports rotation of the support shaft 13, a support shaft fixing member 15 for fixing the support shaft 13 to the frame portion 12, and a friction member 16 provided in the outer circumference of the frame portion 12.

The block body 11 and the frame portion 12 of the balance block 10 may be provided in a form to be easily rotated in accordance with a weight balance between the magnetic body 20 and the magnetic shielding block 30, for example, in the form of a cylinder as shown in FIG. 4.

The block body 11 of the balance block 10 serves as an installation site of the magnetic body 20, as shown in FIG. 4. The form of the existing magnetic wheels including several permanent magnets has low spatial efficiency since a certain distance between adjacent permanent magnets must be maintained. On the contrary, the magnetic which of this embodiment, can show a larger adsorptive force since a larger magnetic body 20 can be used.

The frame portion 12 of the balance block 10 plays a role as a wheel and the friction member 16 made of high-frictional material including rubber is provided on the outer circumference of the frame portion 12.

As shown in FIG. 4, the bearing 14 of the balance block 10 may be provided at both edges of the block body 11 and allows the block body 11 and the frame portion 12 to be smoothly rotated.

The support shaft fixing member 15 of the balance block 10 is provided to fix the support shaft 13 to the frame portion 12. As shown in FIG. 4, the support shaft fixing member 15 may fix the support shaft 13 to the frame portion 12 by being inserted in a hole formed in the frame portion 12.

In this embodiment, the support shaft fixing member 15 may be a bolt having a screw thread formed on its circumference, which is screwed to a screw thread formed in the screw hole formed in the frame portion 12.

As shown in FIG. 4, the magnetic body 20 is provided in the block body 11 of the balance block 10 and serves to attach the block body 11 to the attachment object P.

In this embodiment, as shown in FIG. 5, the magnetic body 20 may be singly provided at the edge of the block body 11. In this embodiment, since a magnetic force generated in the magnetic body 20 is concentrated toward the attachment object P by the magnetic shielding block 30 to be described later, the number of magnets can be reduced, thereby reducing production costs.

In addition, in this embodiment, since the magnetic body 20 is provided in the block body 11, the position of the magnetic body 20 is little changed even when the frame portion 12 is rotated and, accordingly, an adsorptive force applied to the attachment object P is little changed, thereby maintaining a uniform adsorptive force.

In this embodiment, the magnetic body 20 includes a permanent magnet.

Figure 7:
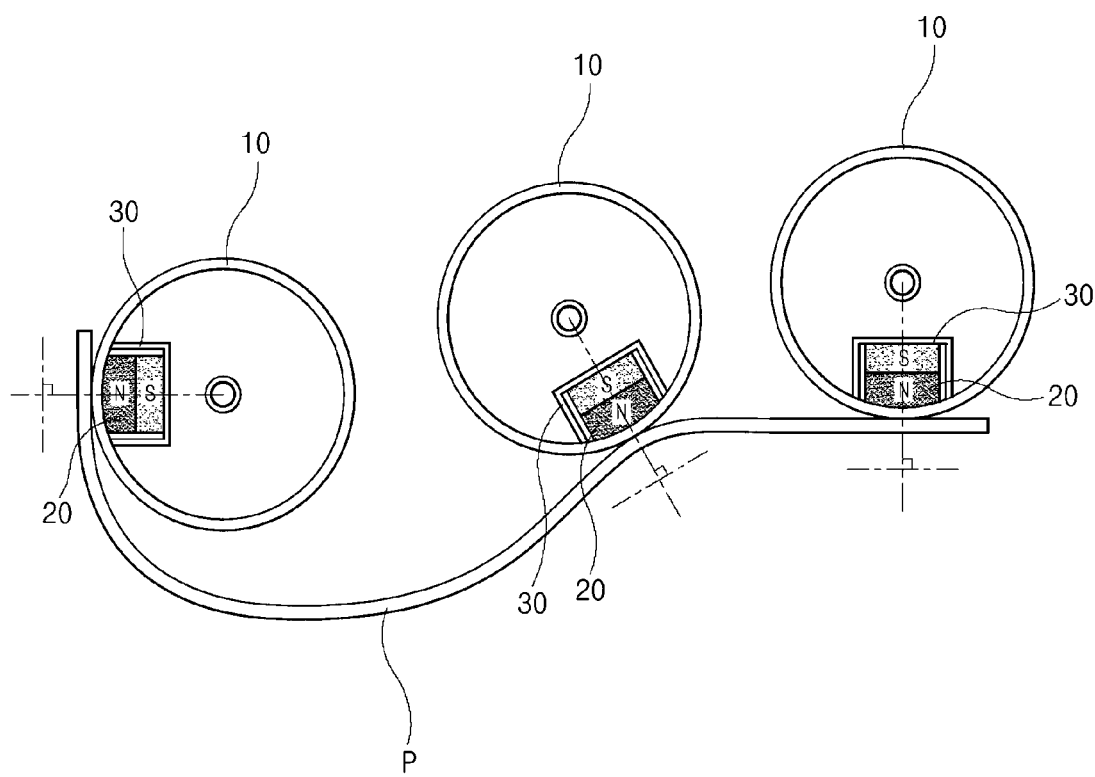
FIG. 7 is a state diagram of use of the magnetic wheel shown in FIG. 3.

In addition, in this embodiment, in order to minimize a distance between the magnetic body 20 and the attachment object P, the bottom of the magnetic body 20 may be in contact with the inner circumference of the block body 11) (see FIG. 7).

As shown in FIG. 5, the magnetic shielding block 30 is provided at the edge of the block body 11 and serves to concentrate the magnetic field generated in the magnetic body 20 toward the attachment object P, thereby preventing damage due to the magnetic field.

In addition, since a degree of concentration of the magnetic field can be increased by the magnetic shielding block 30, the number of magnetic bodies 20 can be reduced.

In this embodiment, as shown in FIG. 6, the magnetic shielding block 3D includes a ceiling portion 32 for shielding the magnetic field generated in the magnetic body 20 from going toward the center of the balance block 10, and a wall portion 31 which is connected to the ceiling portion and prevents the magnetic field from ejecting in the vertical and horizontal directions of the magnetic body 20.

In this embodiment, the magnetic shielding block 30 may be fitted in or welded to a groove formed in the block body 11.

FIG. 7 is a state diagram of use of the magnetic wheel according to this embodiment.

In this embodiment, as shown in FIG. 7, when the magnetic wheel is used for the attachment object P, since the position of the magnetic body 20 is little changed even when the balance block 10 is rotated and, accordingly, an adsorptive force of the magnetic body 20 is little changed. Accordingly, the adsorptive force can be kept, uniform.

In addition, in this embodiment, even when the balance block 10 is rotated, since the magnetic body 20 is perpendicular to the attachment object P, the magnetic wheel can be stably attached to the attachment object P.

Figure 8:
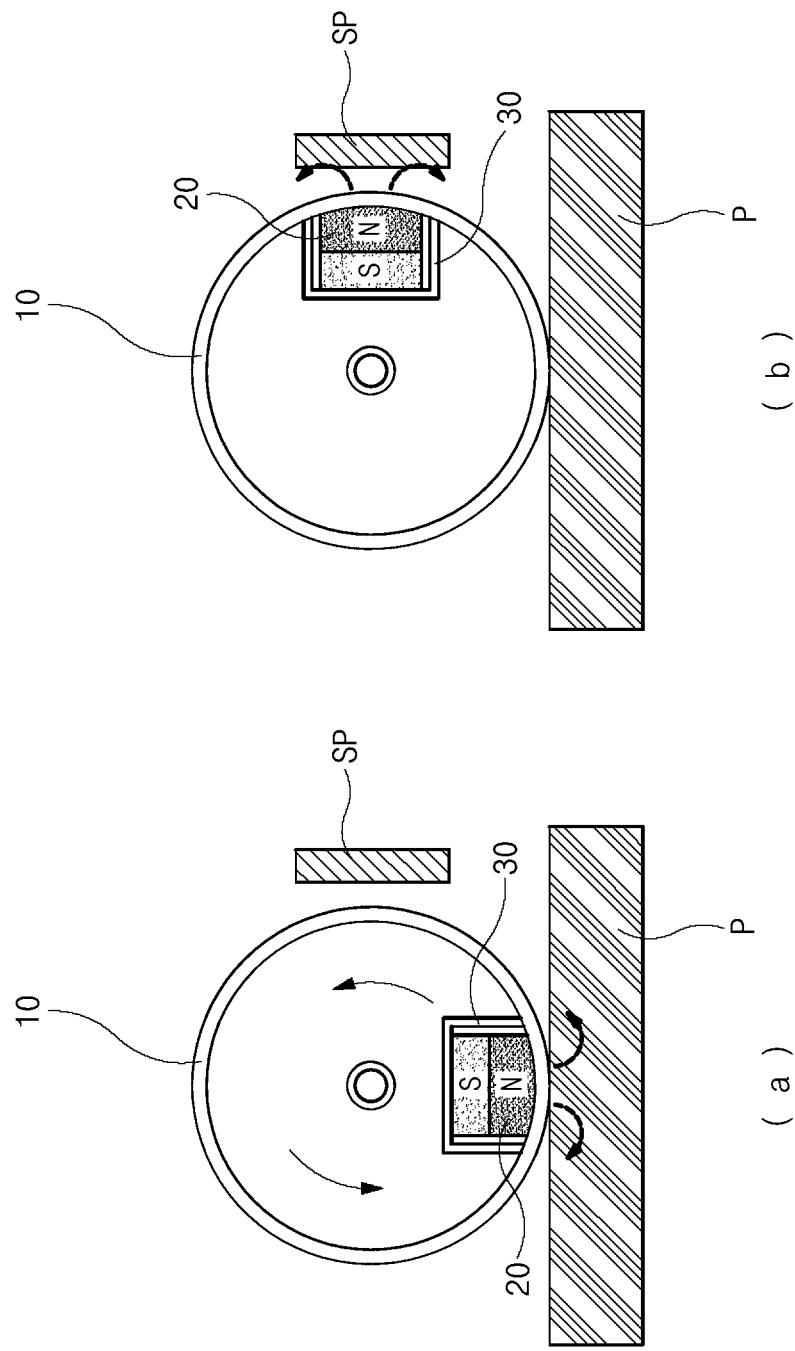
FIG. 8 is a schematic view showing how to detach the magnetic wheel shown in FIG. 3 from an attachment object.

FIG. 8 is a schematic view showing how to detach the magnetic wheel of this embodiment from the attachment object.

When the balance block 10 shown in FIG. 8(a) is counterclockwise rotated by 90° to cause the magnetic body 20 to face a magnet stop plate SP, a magnetic force line exerts on the magnet stop plate SP (ferromagnetic material) without having an effect on the attachment object P, as shown in FIG. 8(b), thereby allowing the magnetic wheel to be easily detached from the attachment object P.

For reference, the magnet stop plate SP may be provided in an apparatus body.

Figure 9:
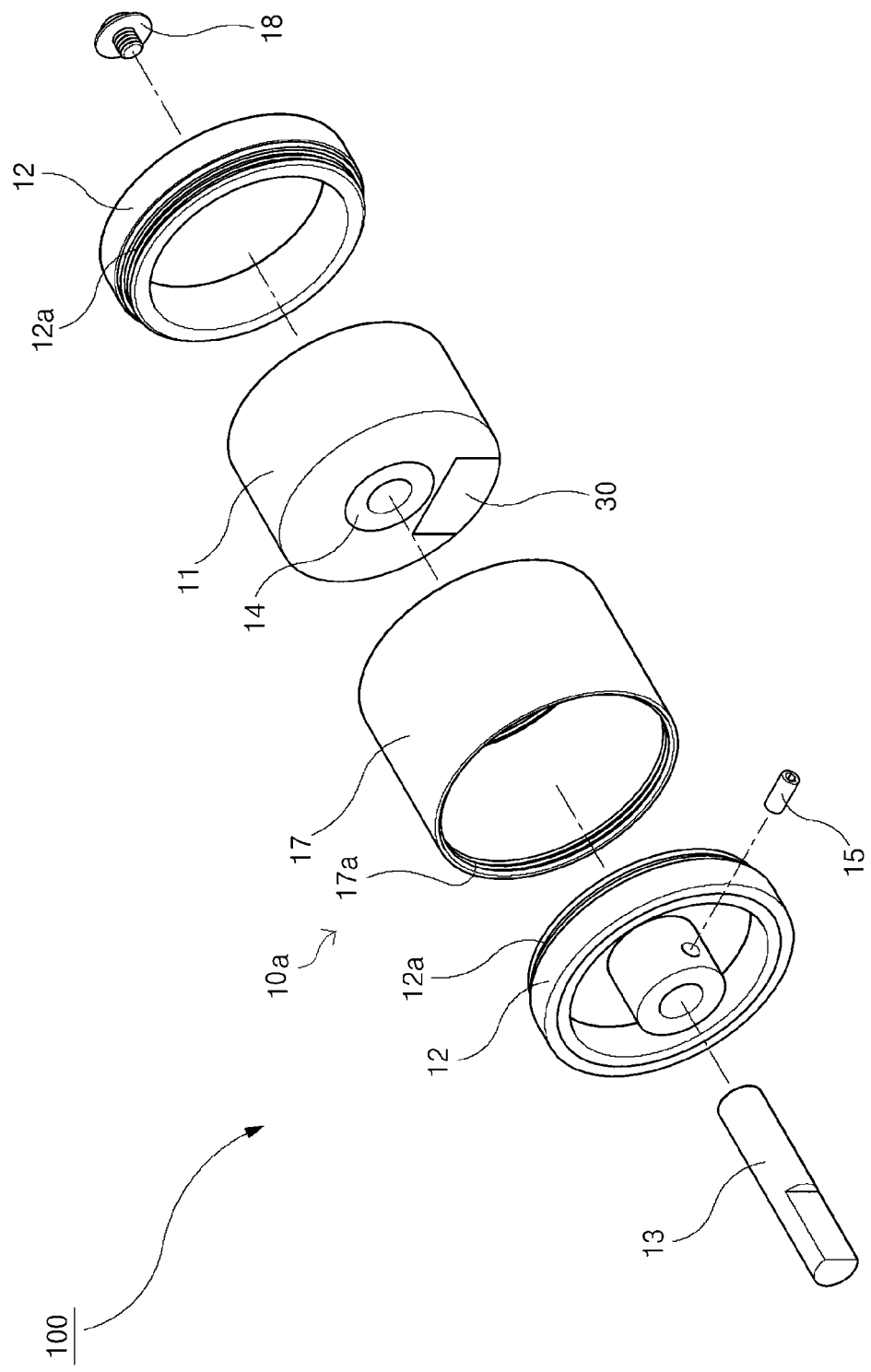
FIG. 9 is a schematic perspective view showing a magnetic wheel according to a second embodiment of the present invention.

FIG. 9 is a schematic perspective view showing a magnetic wheel according to a second embodiment of the present invention.

The second embodiment is different from the first embodiment in that a balance block 10a of a magnetic wheel 100 according to the second embodiment further includes a case 17 in which the block body 11 is accommodated and the frame portion 12 is removably screwed to the case 17.

As shown in FIG. 9, the case 17 may be provided in a shape corresponding to the block body and its interior may be empty to allow the block body to be accommodated therein.

In addition, a female screw thread to be screwed with a male screw thread of the frame portion may be formed in both sides of the case 17.

In addition, in the second embodiment, in order to prevent departure of the support shaft, a locking bolt may be removably joined to one or both sides of the support shaft.

Figure 10:
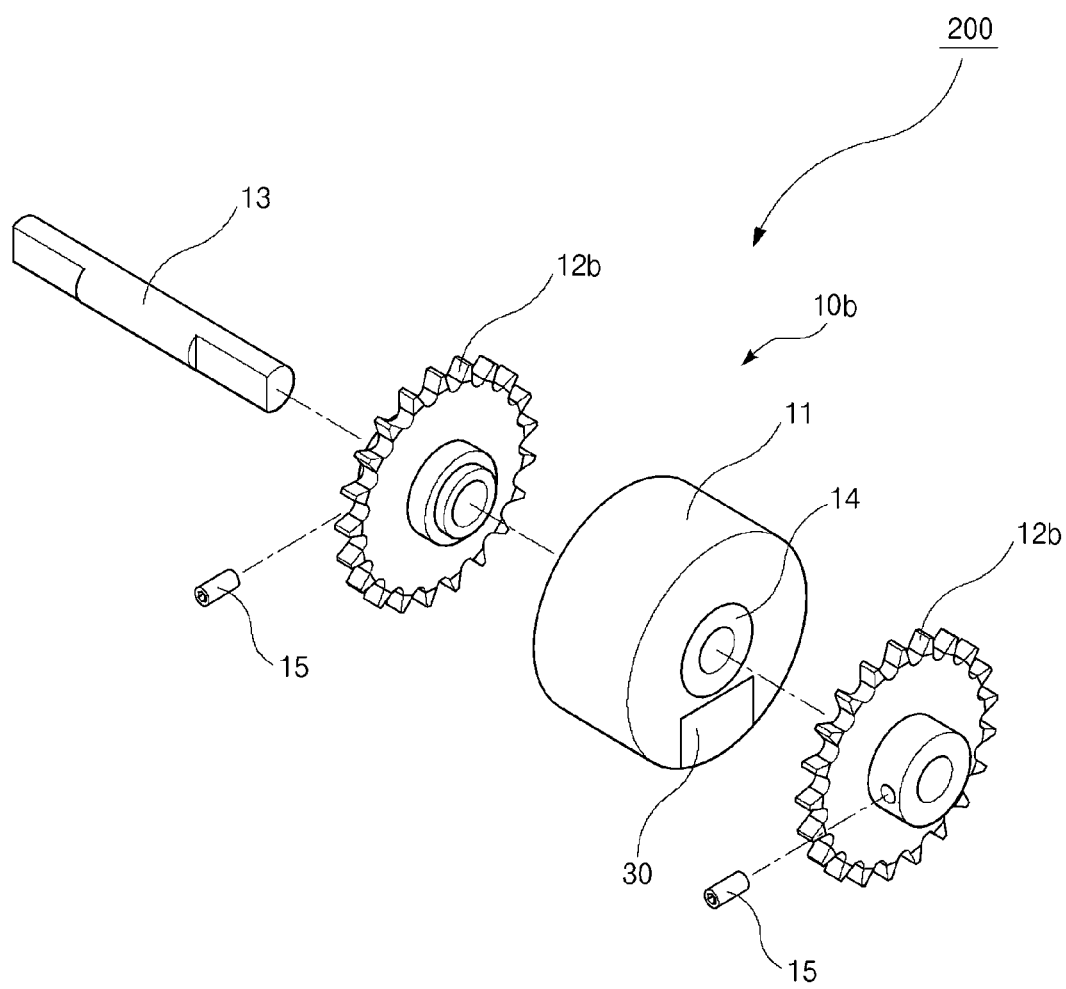
FIG. 10 is a schematic perspective view showing a magnetic wheel according to a third embodiment of the present invention.
Figure 11:
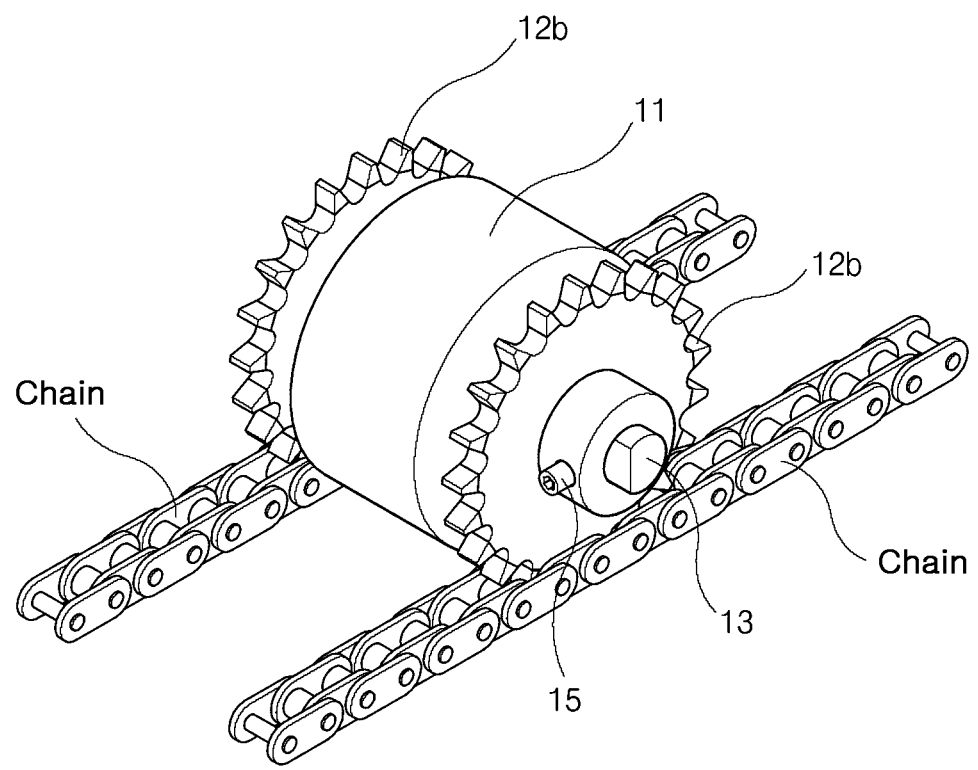
FIGS. 11 and 12 are state diagrams of use of the magnetic wheel shown in FIG. 10.
Figure 12:
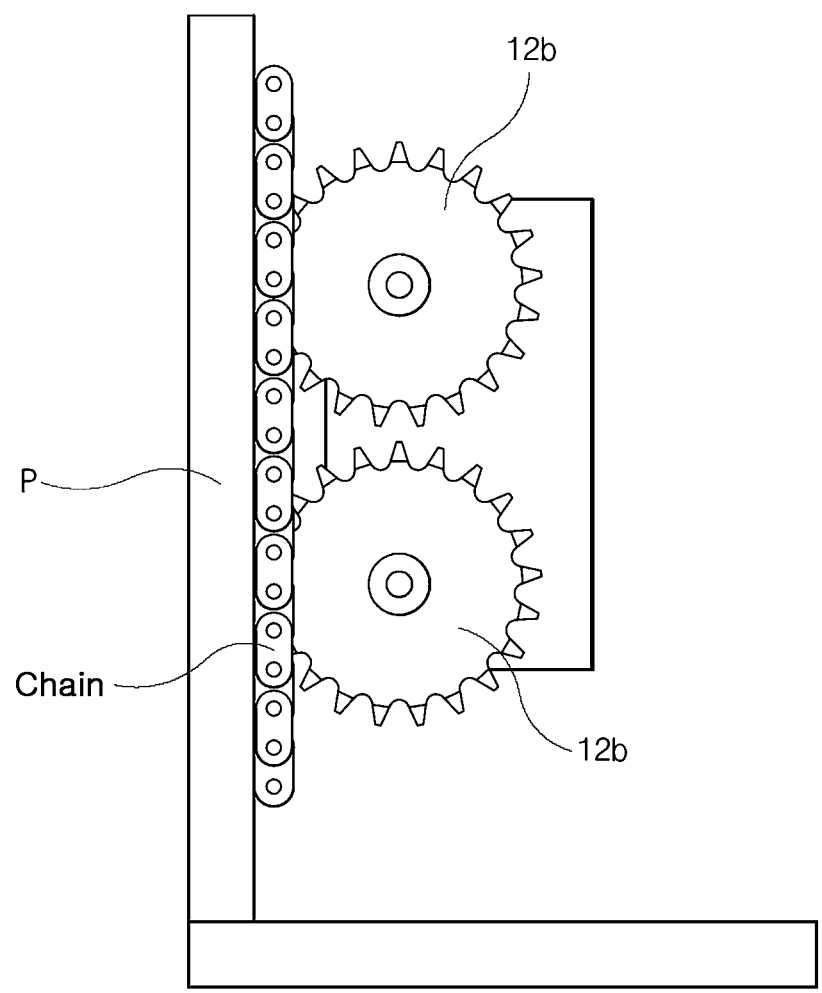

FIG. 10 is a schematic perspective view showing a magnetic wheel according to a third embodiment of the present invention. FIGS. 11 and 12 are state diagrams of use of the magnetic wheel shown in FIG. 10.

The third embodiment is different from the above-described embodiments in that a magnetic wheel 200 of the third embodiment includes a frame portion 12b of a balance block 10b, which is in the form of a sprocket rather than a wheel and is interlocked with chains.

In the third embodiment, as shown in FIG. 10, the frame portion 12b may be provided in the form of a sprocket and may be connected to the chains which can be rotated by the sprocket.

In addition, as shown in FIG. 12, the magnetic wheel. 200 of the third embodiment can be connected to an apparatus body for use in a ceiling and a floor as well as a wall and can be applied to a ship cleaning apparatus and a welding apparatus. This can be equally applied to following embodiments as well as the above-described embodiments.

Figure 13:
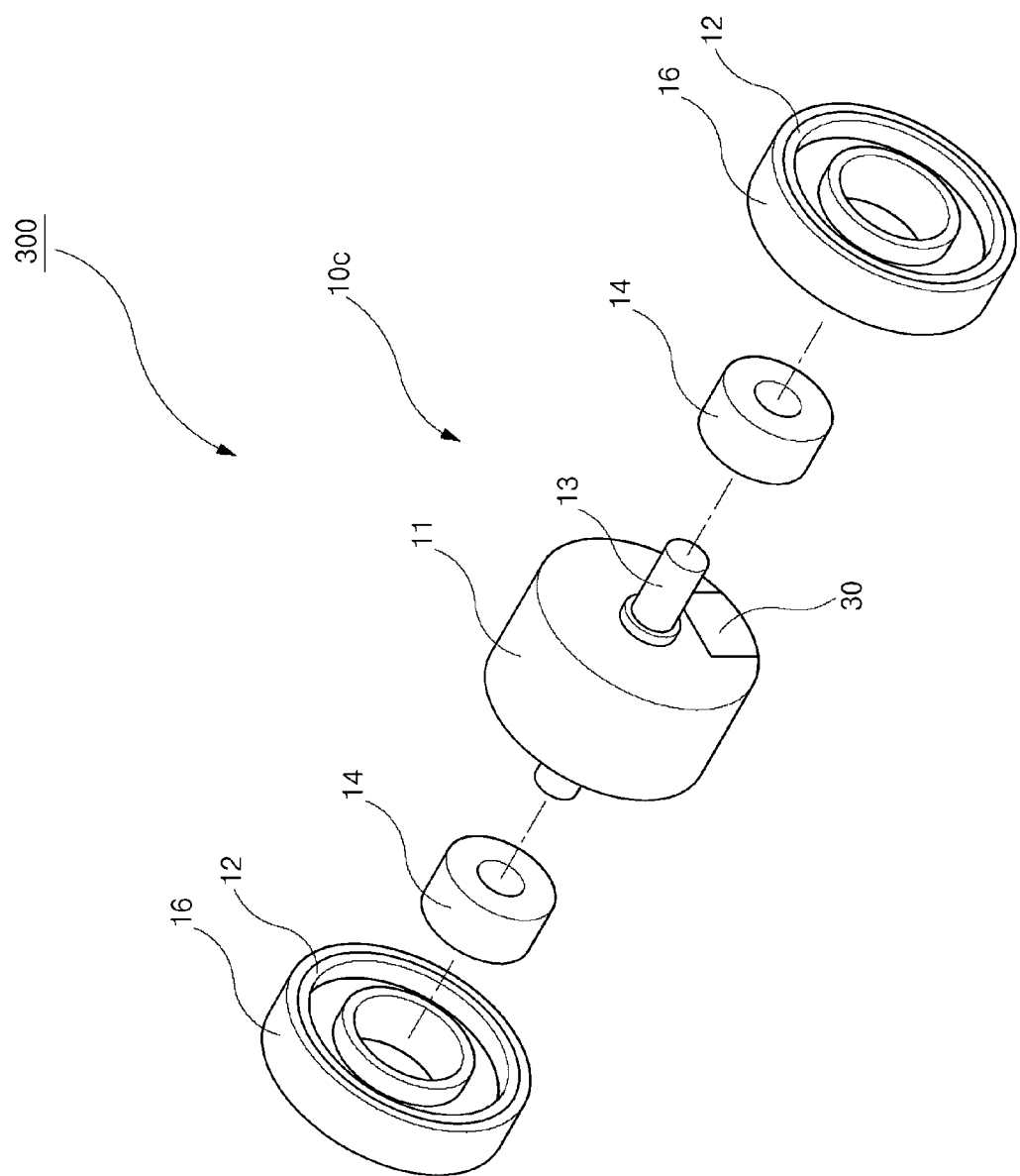
FIG. 13 is a schematic perspective view a magnetic wheel according to a fourth embodiment of the present invention.
Figure 14:
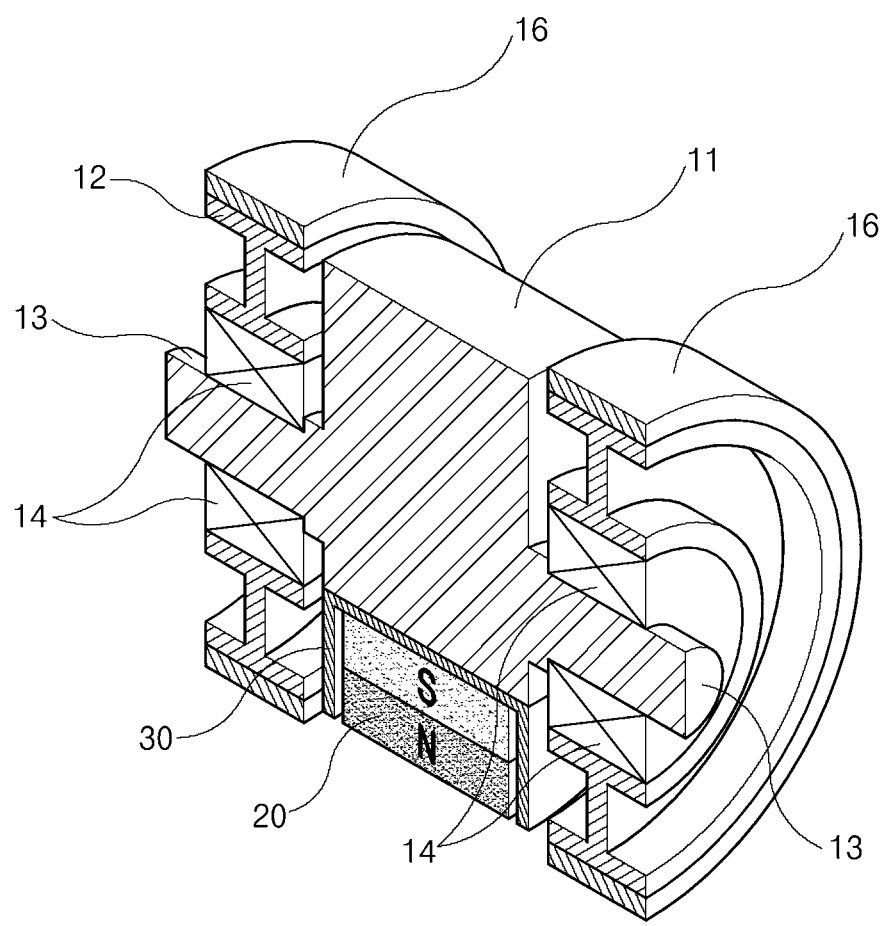
FIG. 14 is a combined sectional view of the magnetic wheel shown in FIG. 13.
Figure 15:
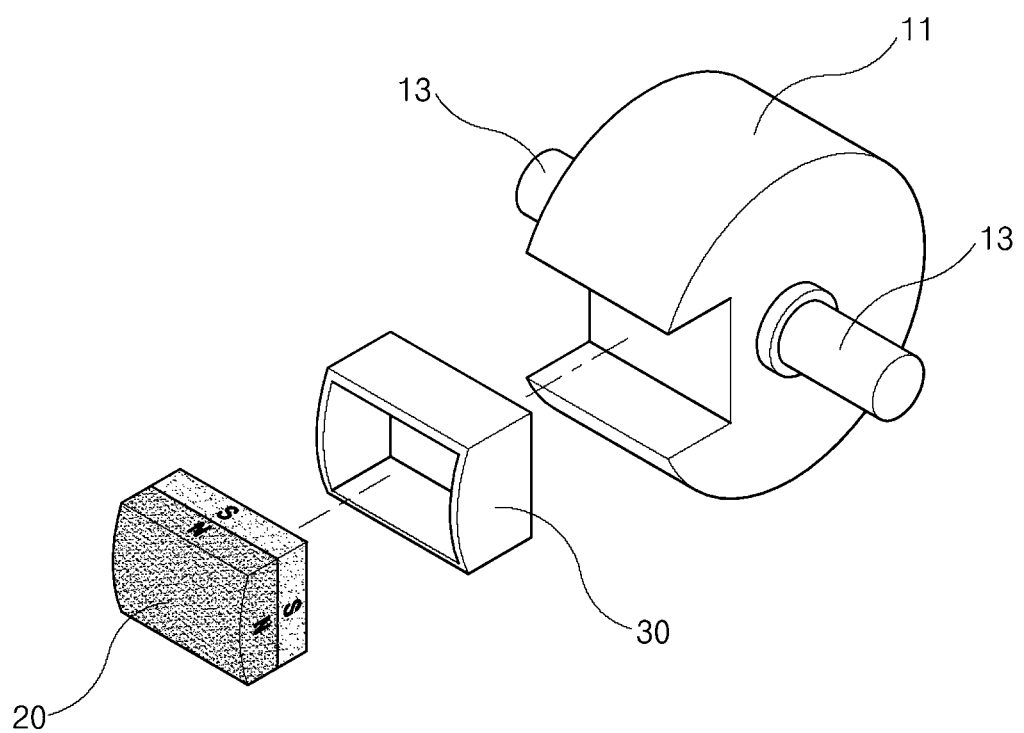
FIG. 15 is a schematic exploded perspective view showing a state where the magnetic body and the magnetic shielding block of FIG. 13 are exploded.

FIG. 13 is a schematic perspective view a magnetic wheel according to a fourth embodiment of the present invention. FIG. 14 is a combined sectional view of the magnetic wheel shown in FIG. 13. FIG. 15 is a schematic exploded perspective view showing a state where the magnetic body and the magnetic shielding block of FIG. 13 are exploded.

The fourth embodiment is different from the above-described embodiments in that a balance block 10 of a magnetic wheel 300 of the fourth embodiment has a support shaft 13 integrated with a block body 11 and a bearing 14 is provided in a frame portion 12 rather than the block body 11.

In this case, since the support shaft 13 need not be coupled to the block body 11, work man-hour can be reduced.

Figure 16:
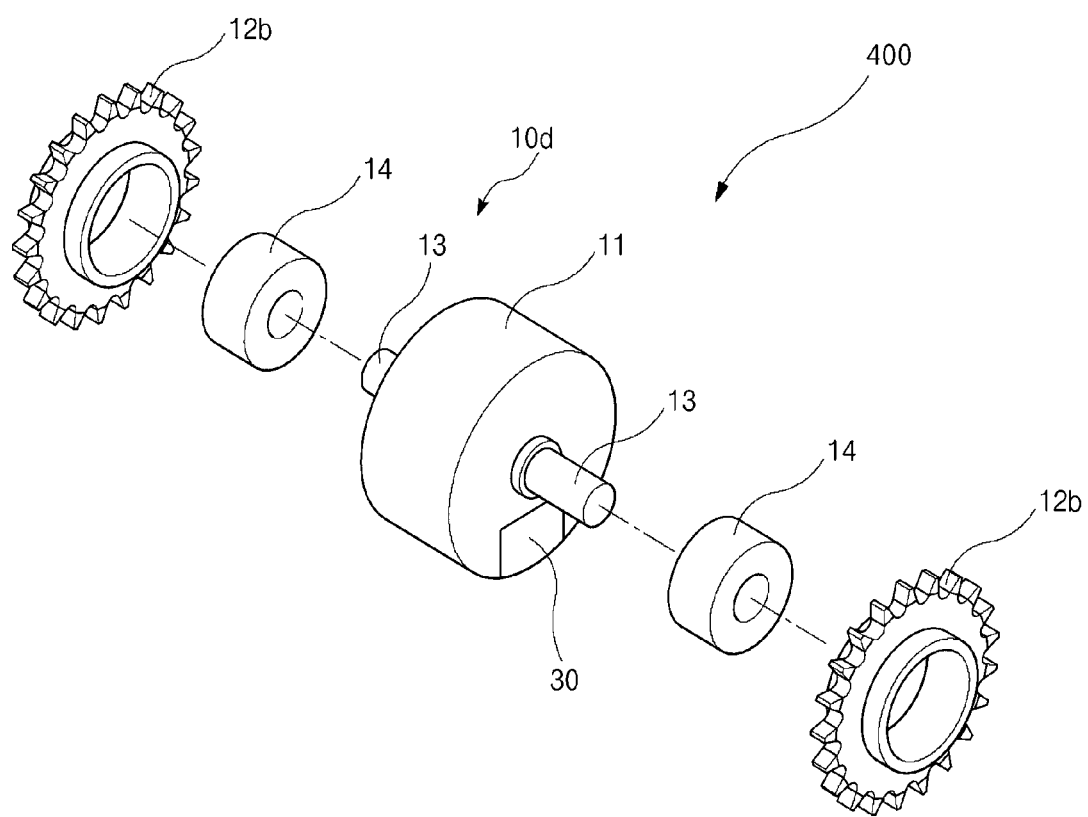
FIG. 16 is a schematic perspective view a magnetic wheel according to a fifth embodiment of the present invention.

FIG. 16 is a schematic perspective view a magnetic wheel according to a fifth embodiment of the present invention.

The fifth embodiment is different from the above-described fourth embodiment in that, a magnetic wheel 400 of the fifth embodiment includes a balance block 100d having a frame portion 12 which is in the form of a sprocket.

Figure 17:
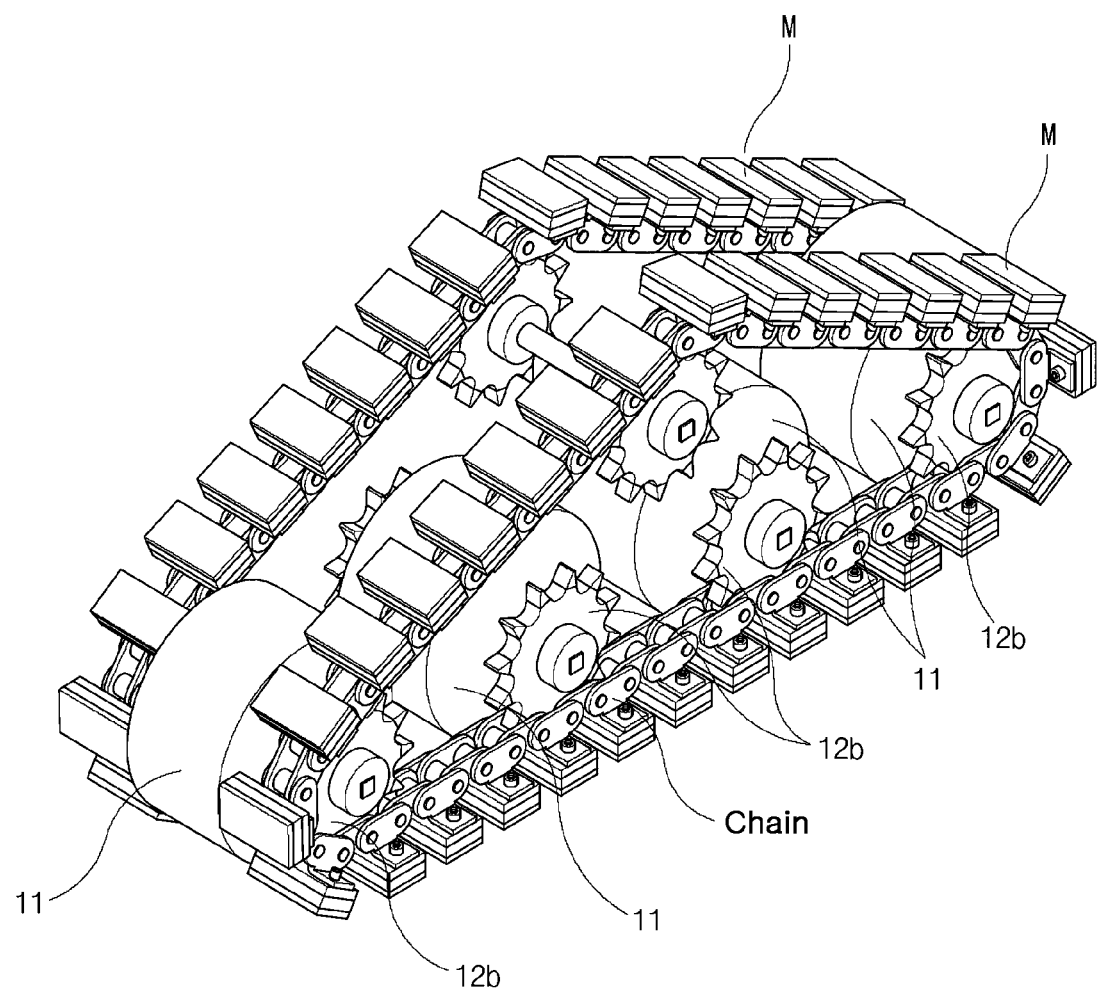
FIG. 17 is a schematic view showing a utilization example of these embodiments.

FIG. 17 is a schematic view showing a utilization example of the above-described embodiments. These embodiments may have an application of a caterpillar M.

As described above, according to the above-described embodiments, a magnetic adsorptive force is not rapidly weakened even when the magnetic wheel is detached from a ferromagnetic floor and an effect of a magnetic field on the vicinity of the magnetic wheel can be minimized by magnetic shielding capability.

While the present invention has been particularly shown and described, with reference to exemplary embodiments thereof, it will be understood by those skilled in the art that various changes in form and details may be made therein without departing from the spirit and scope of the present invention. The exemplary embodiments are provided for the purpose of illustrating the invention, not in a limitative sense. Thus, it is intended that the present invention covers the modifications and variations of this invention provided they come within the scope of the appended claims and their equivalents.

What is claimed is:

1. A magnetic wheel comprising:
   a balance block;
   a magnetic body which is provided in the balance block and attaches the balance block to an attachment object with a magnetic force; and
   a magnetic shielding block which is provided in the balance block and guides a magnetic field generated in the magnetic body toward the attachment object,
   wherein the balance block comprises:
      a circular block body; and
      a frame portion which is provided at an edge of the block body and has a larger diameter than the block body.

2. The magnetic wheel according to claim 1, wherein the magnetic shielding block shields all regions except the bottom of the magnetic body directing to the attachment object.

3. The magnetic wheel according to claim 1, wherein the magnetic shielding block includes:
   a ceiling portion for shielding the magnetic field generated in the magnetic body from going toward the center of the balance block; and
   a wall portion which is connected to the ceiling portion and prevents the magnetic field from ejecting in the lateral directions of the magnetic body.

4. The magnetic wheel according to claim 1, wherein the magnetic shielding block is coupled to the balance block according to one selected from a group consisting of fitting and welding.

5. The magnetic wheel according to claim 1, wherein the magnetic shielding block is provided to be perpendicular to the center of the balance block.

6. The magnetic wheel according to claim 1, wherein the magnetic body is provided in the block body.

7. The magnetic wheel according to claim 1, wherein a bearing to rotatably support a rotating shaft passing through the block body is provided in the block body.

8. The magnetic wheel according to claim 1, wherein a friction member is provided in the block body.

9. The magnetic wheel according to claim 1, wherein the balance block is removably coupled to the block body or is integrated with the block body.

10. The magnetic wheel according to claim 1, wherein the magnetic body includes a permanent magnet.

* * * * *